United States Patent
Choi et al.

(10) Patent No.: US 10,360,984 B2
(45) Date of Patent: Jul. 23, 2019

(54) DATA STORAGE DEVICE AND METHOD OF OPERATING THE SAME

(71) Applicant: SK hynix Inc., Gyeonggi-do (KR)

(72) Inventors: Young Geun Choi, Gyeonggi-do (KR); Min Kee Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/845,406

(22) Filed: Dec. 18, 2017

(65) Prior Publication Data
US 2019/0057745 A1    Feb. 21, 2019

(30) Foreign Application Priority Data
Aug. 18, 2017 (KR) .................. 10-2017-0104645

(51) Int. Cl.
| | | |
|---|---|---|
| G11C 16/04 | (2006.01) | |
| G11C 16/26 | (2006.01) | |
| G06F 12/02 | (2006.01) | |
| G06F 3/06 | (2006.01) | |
| G06F 9/30 | (2018.01) | |
| G06F 13/16 | (2006.01) | |

(52) U.S. Cl.
CPC ............ G11C 16/26 (2013.01); G06F 3/0679 (2013.01); G06F 9/30029 (2013.01); G06F 12/0246 (2013.01); G06F 13/1673 (2013.01)

(58) Field of Classification Search
CPC ...................................................... G11C 16/26
USPC ...................................................... 365/185.03
See application file for complete search history.

(56) References Cited

U.S. PATENT DOCUMENTS

2017/0075622 A1*   3/2017   Kwon .................. G06F 3/0647

FOREIGN PATENT DOCUMENTS

KR        100359414         1/2003

* cited by examiner

Primary Examiner — Hoai V Ho
(74) Attorney, Agent, or Firm — IP & T Group LLP

(57) ABSTRACT

A data storage device includes a non-volatile memory device and a controller. The controller is configured to calculate a read range including read regions that may correspond to each of read commands for the same physical address among a plurality of read commands received from a host device. The controller may be configured to generate an integral read command for simultaneously reading the calculated read range. The controller may transmit the integral read command to the non-volatile memory device.

20 Claims, 13 Drawing Sheets

FIG.7

| | S1/PNE1 | S2/PNE1 | S1/PNE2 | S2/PNE2 | S1/PNE3 | S2/PNE3 | S1/PNE4 | S2/PNE4 | |
|---|---|---|---|---|---|---|---|---|---|
| Physical Address | \multicolumn{8}{c|}{Valid Sector BMP} | |
| RCMD1 0x00 | 1 | 1 | 0 | 0 | 0 | 0 | 0 | 0 | |
| | OR | OR | OR | OR | OR | OR | OR | OR | |
| RCMD2 0x00 | 0 | 0 | 1 | 1 | 0 | 0 | 0 | 0 | |
| | OR | OR | OR | OR | OR | OR | OR | OR | |
| RCMD3 0x00 | 0 | 0 | 0 | 0 | 1 | 1 | 0 | 0 | |
| | OR | OR | OR | OR | OR | OR | OR | OR | |
| RCMD4 0x00 | 0 | 0 | 0 | 0 | 0 | 0 | 1 | 1 | |
| | = | = | = | = | = | = | = | = | |
| CRCMD 0x00 | 1 | 1 | 1 | 1 | 1 | 1 | 1 | 1 | |
| | B7 | B6 | B5 | B4 | B3 | B2 | B1 | B0 | |

DATA STORAGE DEVICE AND METHOD OF OPERATING THE SAME

CROSS-REFERENCES TO RELATED APPLICATION

The present application claims priority under 35 U.S.C. § 119(a) to Korean application number 10-2017-0104645, filed on Aug. 18, 2017, which is incorporated herein by reference in its entirety.

BACKGROUND

1. Technical Field

Various embodiments generally relate to a semiconductor device and, more particularly, to a data storage device and a method of operating the data storage device.

2. Related Art

Recently, the paradigm of computer environments has been changed into a ubiquitous computing system that can be used anytime and anywhere. Thus, a portable electronic device such as a cellular phone, a digital camera, a notebook computer, etc., may be widely used. The portable electronic device may include a data storage device using a memory device. The data storage device may be used for storing data of the portable electronic device.

A data storage device using a memory device generally has excellent stability and durability because it does not include a mechanical driving mechanism. Further, a data storage device using a memory device is advantageous in that it may access data faster and consume less power. Non-limiting examples of a data storage device having such advantages include a universal serial bus (USB) memory card, a memory card including various interfaces, a universal flash storage (UFS) card, a solid sage drive (SSD), and the like.

SUMMARY

Example embodiments provide a data storage device that is capable of preventing deterioration of the characteristics of the memory cells employed in the storage device. The data storage device may also exhibit an improved read capacity.

Example embodiments also provide a method of operating the above-mentioned data storage device.

In an embodiment, a data storage device may include a non-volatile memory device and a controller. The controller may be configured to calculate a read range including read regions that may correspond to each of read commands for the same physical address, among a plurality of read commands received from a host device. The controller may be configured to generate an integral read command for simultaneously reading the calculated read range. The controller may transmit the integral read command to the non-volatile memory device.

In an embodiment, in a method of operating a data storage device, read commands for the same physical address among a plurality of read commands received from a host device may be detected. A read range including read regions of each of the detected read commands may be calculated. An integral read command for simultaneously reading the read regions in the calculated read range may be generated. The generated integrated read command may be transmitted to a non-volatile memory device.

In an embodiment, a data storage device may include a non-volatile memory device and a controller configured to control operations of the non-volatile memory device. The controller may include a read command manager configured to calculate a read range including read regions corresponding to each of read commands for the same physical address, among read commands received from a host device, to generate an integral read command for simultaneously reading the read range, and to transmit the integral read command to the non-volatile memory device.

These and other features and advantages of the present invention will become apparent to those skilled in the art of the present invention from the following detailed description in conjunction with the accompanying claims.

BRIEF DESCRIPTION OF THE DRAWINGS

FIG. 7 is a diagram illustrating operations of the read command manager for calculating a read range and generating an integral read command.

DETAILED DESCRIPTION

Hereinafter, example embodiments will be described below with reference to the accompanying drawings through various examples of embodiments.

Figure 1:
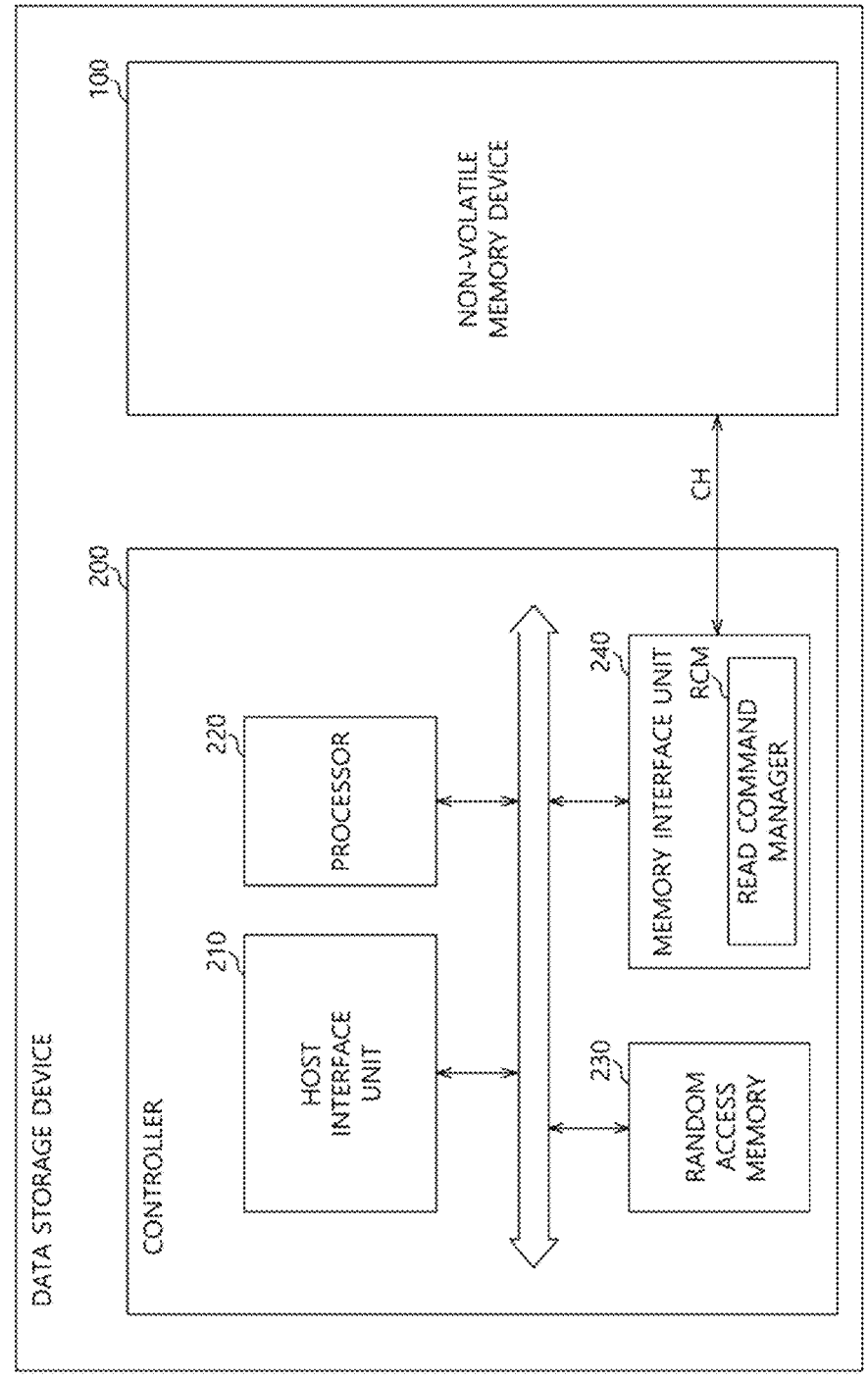
FIG. 1 is a block diagram illustrating a data storage device in accordance with an embodiment of the present invention.
Figure 2:
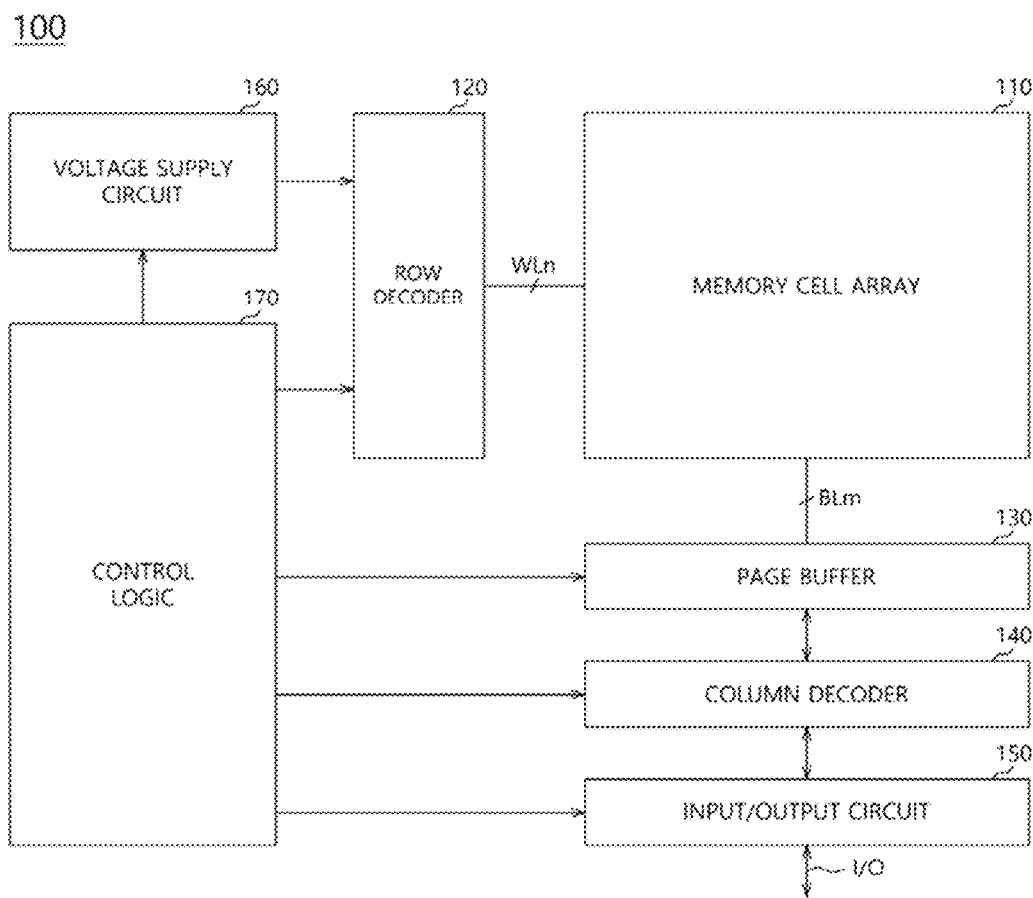
FIG. 2 is a block diagram illustrating an exemplary configuration of a non-volatile memory device shown in FIG. 1.
Figure 3:
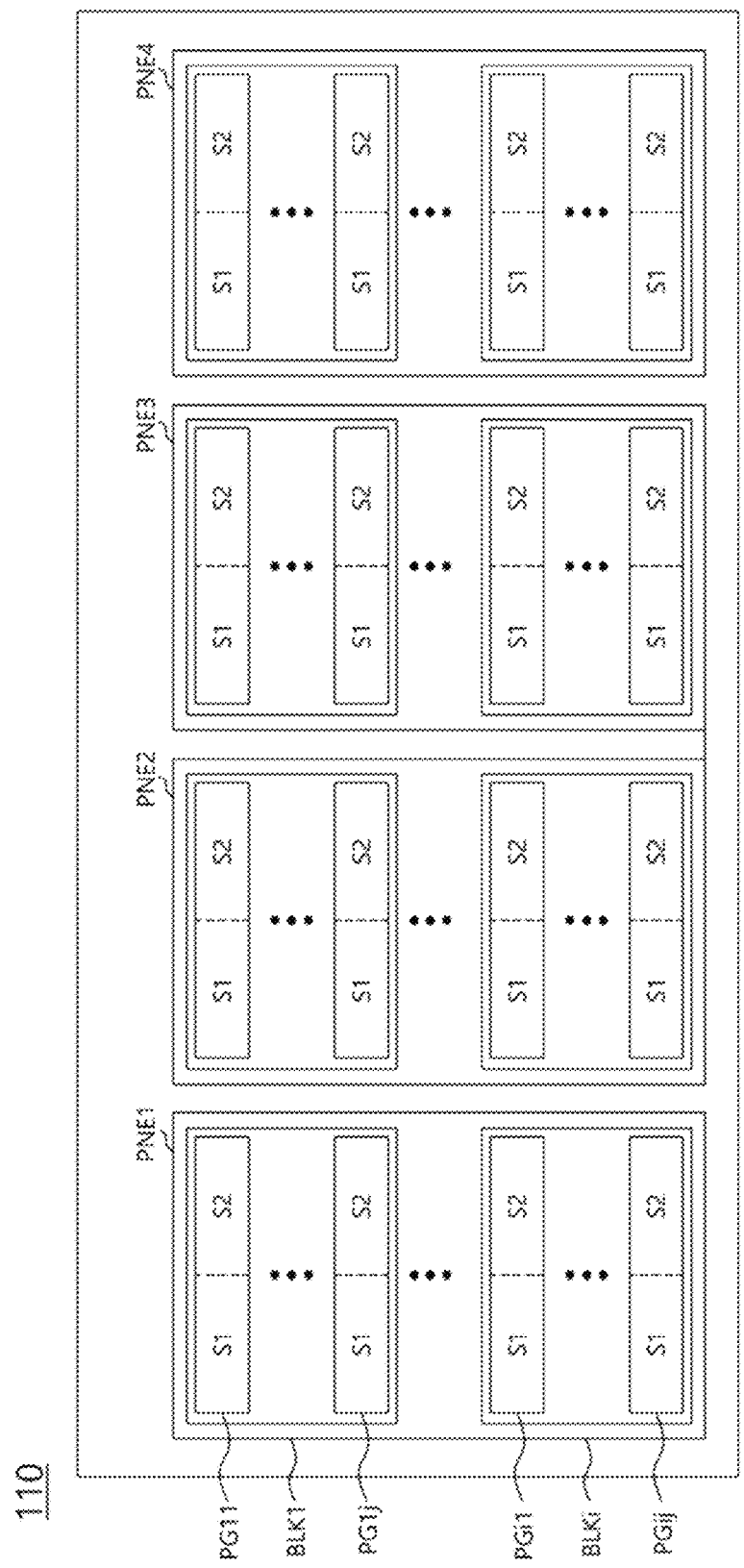
FIG. 3 is a block diagram illustrating an exemplary configuration of a memory cell array shown in FIG. 2.

FIG. 1 is a block diagram illustrating a data storage device 10 in accordance with an embodiment of the present invention, FIG. 2 is a block diagram illustrating an exemplary configuration of a non-volatile memory device 100 of FIG. 1, FIG. 3 is a block diagram illustrating an exemplary configuration of a memory cell array 110 of FIG. 2, and FIG.

4 is a block diagram illustrating an exemplary configuration of a random access memory 230 of FIG. 1.

Referring to FIG. 1, the data storage device 10 may be configured to store data which can be accessed by a host device (not shown) such as a cellular phone, an MP3 player, a laptop computer, a desktop computer, a game machine, a television (TV), an in-vehicle infotainment system, etc. The data storage device 10 may also be referred to as a memory system.

The data storage device 10 may be implemented as one of various storage devices according to an interface protocol connected with the host device. For example, various implementations of the data storage device 10 may include any one of a solid state drive (SSD), a multimedia card such as an MMC, an eMMC, an RS-MMC, a micro-MMC, etc., a secure digital card such as an SD, a mini-SD, a micro-SD, etc., a storage device such as a universal storage bus (USB), a universal flash storage (UFS), a personal computer memory card international association (PCMCIA), etc., a peripheral component interconnection card, a PCI-express (PCI-E) card, a compact flash (CF) card, a smart media card, a memory stack, and the like.

The data storage device 10 may have any one of various package structures. For example, the data storage device 10 may have a package-on-package (POP), a system-in-package (SIP), a system-on-chip (SOC), a multi-chip package (MCP), a chip-on-board (COB), a wafer-level fabricated package (WFP), a wafer-level stack package (WSP), and the like.

The data storage device 10 may include the non-volatile memory device 100 and a controller 200.

The non-volatile memory device 100 may be operated as a storage medium of the data storage device 10. The non-volatile memory device 100 may include a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using chalcogenide compounds, a resistive random access memory (RERAM) using a transition metal oxide compound, and the like.

Referring to FIG. 2, the non-volatile memory device 100 may include the memory cell array 110, a row decoder 120, a page buffer 130, a column decoder 140, an input/output circuit 150, a voltage supply circuit 160 and a control logic 170.

The memory cell array 110 may include memory cells arranged at intersected regions between word lines WLn and bit lines BLm. For example, the memory cells may include single level cells (SLC) configured to store one bit, or multi-level cells (MLC) configured to store two or more bits, such as triple level cells (TLC) configured to store three bits, quad level cells (QLC) configured to store four bits, etc. The memory cell array 110 may include at least one of the SLC, or MLC cells. The memory cell array 110 may have a two-dimensional structure or a three-dimensional structure.

The memory cell array 110 may include a plurality of planes. Each of the planes may include a plurality of blocks. Each of the blocks may include a plurality of pages.

Referring to FIG. 3, for example, the memory cell array 110 may include four planes PNE1 to PNE4. Each of the planes PNE1 to PNE4 may include blocks BLK1 to BLKi. Each of the blocks BLK1 to BLKi may include pages PG1 to PGj. Each of the pages PG1 to PGj may include two sectors S1 and S2. Each of the sectors S1 and S2 may correspond a half page. Alternatively, the memory cell array 110 may not be restricted within the structure in FIG. 3.

Referring back to FIG. 2, the row decoder 120 may be configured to select any one of the word lines WLn connected with the memory cell array 110. For example, the row decoder 120 may select any one of the word lines WLn based on a row address received from the control logic 170. The row decoder 120 may provide the selected word line with a word line voltage provided from the voltage supply circuit 160.

The page buffer 130 may be connected with the memory cell array 110 through the bit lines BLm. The page buffer 130 may be configured to temporarily store program data written in the memory cell array 110 or read data read from the memory cell array 110, according to control of the control logic 170.

The column decoder 140 may be configured to select any one of the bit lines BLm connected with the memory cell array 110. For example, the column decoder 140 may select any one of the bit lines BLm based on a column address received from the control logic 170.

The input/output circuit 150 may be connected with the controller 200 through input/output lines I/O. The input/output circuit 150 may transmit/receive commands, addresses and data to/from the controller 200 through the input/output lines I/O, according to control of the control logic 170.

The voltage supply circuit 160 may be configured to generate voltages used for operating the non-volatile memory device 100, according to control of the control logic 170. The voltages generated by the voltage supply circuit 160 may be applied to the memory cells of the memory cell array 110. For example, a programming voltage generated in a program operation may be applied to the word line of the memory cells on which the program operation may be performed. Alternatively, an erasing voltage generated in an erase operation may be applied to a well region of the memory cells on which the erase operation may be performed. Alternatively, a reading voltage generated in a read operation may be applied to the word line of the memory cells on which the read operation may be performed.

The control logic 170 may be configured to control operations related to the program operation, the read operation and the erase operation of the non-volatile memory device 100. For example, the control logic 170 may control the operations of the non-volatile memory device 100 to perform the program operation and the read operation in the memory cell array 110 in response to a program command and a read command received from the controller 200. The control logic 170 may control the operations of the non-volatile memory device 100 to perform the erase operation in the memory cell array 110 in response to an erase command received from the controller 200. In an embodiment, the program and the read operations may each be performed on a page unit basis, while the erase operation may be performed on a block unit basis. However, it is noted that the program operation, the read operation and the erase operation may be performed on a different unit basis from the above-mentioned basis and, hence, the invention is not limited in this way.

The control logic 170 may provide the row decoder 120 with a row address for selecting a word line and the column decoder 140 with a column address for selecting a bit line based on addresses received from the controller 200. The control logic 170 may provide the page buffer 130, the input/output circuit 150 and the voltage supply circuit 160 with control signals for controlling them.

In FIG. 1, the data storage device 10 may include one non-volatile memory device 100. Alternatively, the data storage device 10 may include a plurality of the non-volatile memory devices 100. Thus, it is noted that the illustrated embodiments may be applied to a data storage device 10 including one or more non-volatile memory devices 100.

The controller 200 may be configured to control the operations of the data storage device 10 by driving a firmware, a software or a combination thereof disposed in a random access memory. The controller 200 may decode and drive code type instructions or algorithms such as the firmware or the software. The controller 200 may include a hardware or a combination of a hardware and a software.

The controller 200 may include a host interface unit 210, a processor 220, a random access memory 230 and a memory interface unit 240.

The host interface unit 210 may be configured to interface the host device with the data storage device 10 according to a protocol of the host device. For example, the host interface unit 210 may communicate with the host device through any one of a USB, a UFS, an MMC, a parallel advanced technology attachment (PATA), a serial advanced technology attachment (SATA), a small computer system interface (SCSI), a serial attached SISI (SAS), a peripheral component interconnection (PCI) and a PCI-E.

The processor 220 may include a micro control unit (MCU) and a central processing unit (CPU). The processor 220 may be configured to process requests transmitted from the host device. In order to process a request transmitted from the host device, the processor 220 may drive the instructions or the algorithms, i.e., the firmware and or software in the random access memory 230. The processor 220 may control the various blocks or devices, e.g., the 210, 230 and 240 blocks of the controller 200 and the non-volatile memory device 100.

The processor 220 may generate control signals for controlling the operations of the non-volatile memory device 100 based on the various requests transmitted from the host device. The processor 220 may provide the generated control signals to the non-volatile memory device 100 via the memory interface unit 240.

The random access memory 230 may include a dynamic random access memory (DRAM) or a static random access memory (SRAM). The random access memory 230 may be configured to store the firmware driven by the processor 220. The random access memory 230 may be configured to store the data, for example, meta-data for driving the firmware. That is, the random access memory 230 may be operated as a working memory of the processor 220.

The random access memory 230 may be configured to temporarily store program data transmitted from the host device to the non-volatile memory device 100 or read data transmitted from the non-volatile memory device 100 to the host device. That is, the random access memory 230 may be operated as a buffer memory.

Figure 4:
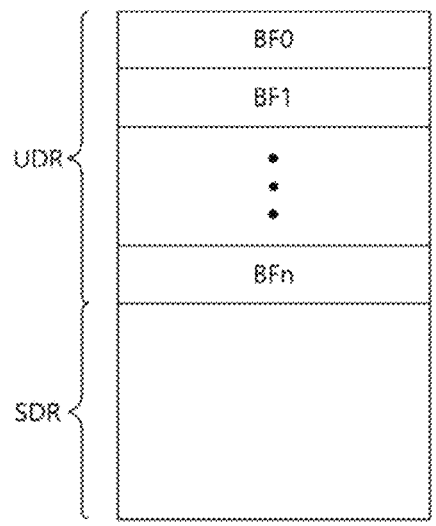
FIG. 4 is a block diagram illustrating an exemplary configuration of a random access memory shown in FIG. 1.

For example, as shown in FIG. 4, the random access memory 230 may include a system data region SDR configured to store the firmware or the software driven by the processor 220 and a user data region UDR configured to temporarily store the program data or the read data. The user data region UDR may include a plurality of buffers BF0 to BFn. Each of the buffer BF0 to BFn may store user data such as program or read data.

Referring back to FIG. 1, the memory interface unit 240 may be configured to control the non-volatile memory device 100 according to the controls of the processor 220. Hence, the memory interface unit 240 may also be referred to as a memory control unit. The memory interface unit 240 may provide the non-volatile memory device 100 with the control signals through a channel CH. The control signals may include commands, addresses, control signals, etc., for controlling the non-volatile memory device 100. The memory control unit 240 may provide the non-volatile memory device 100 with the program data during the program operation. The memory control unit 240 may receive the read data from the non-volatile memory device 100 during the read operation.

The memory interface unit 240 may include a read command manager RCM configured to manage the read commands provided from the processor 220.

Figure 5:
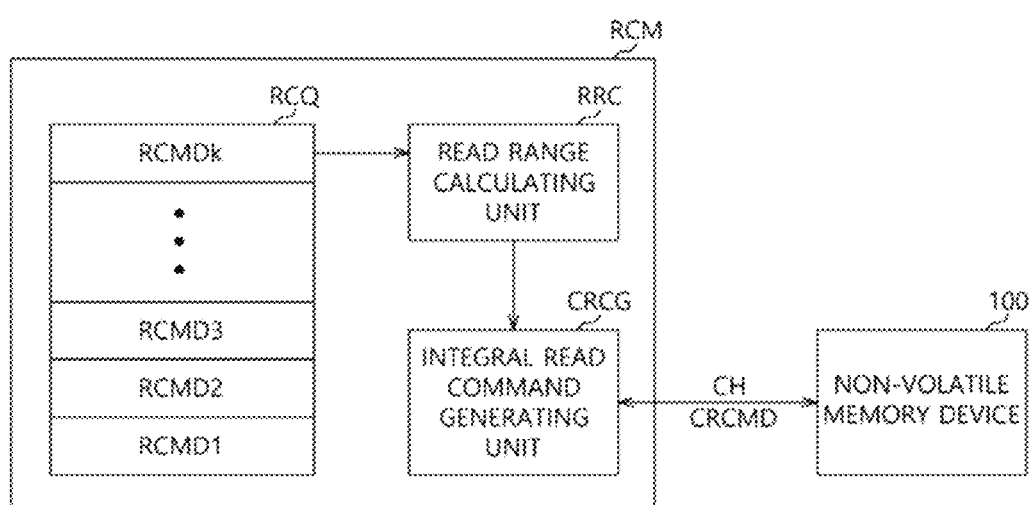
FIG. 5 is a block diagram illustrating an exemplary configuration of a read command manager shown in FIG. 1.

FIG. 5 is a block diagram illustrating an exemplary configuration of the read command manager RCM of FIG. 1.

Referring to FIG. 5, the read command manager RCM may include a read command queuing unit RCQ, a read range calculating unit RRC and an integral read command generating unit CRCG. The read command queuing unit RCQ may be configured to perform a queuing operation in response to the read commands provided from the processor 220, for example, in a first-in first-out (FIFO) manner. The read range calculating unit RRC may be configured to detect read commands for the same physical address, among the read commands RCMD1 to RCMDk on which the queuing operation may be performed. The read range calculating unit RRC may be configured to calculate a read range including read regions of each of the detected read commands. The integral read command generating unit CRCG may be configured to generate an integral read command CRCMD based on the calculated read range. The integral read command generating unit CRCG may provide the non-volatile memory device 100 with the integral read command CRCMD through the channel CH.

Figure 6:
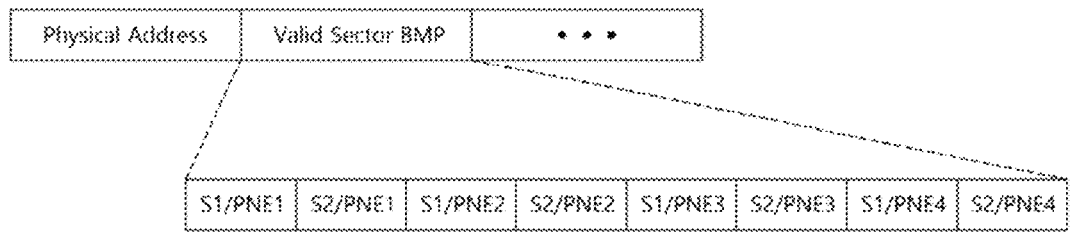
FIG. 6 is a diagram illustrating a field of a read command shown in FIG. 5.

FIG. 6 is a diagram illustrating an exemplary field of the read command RCMD in FIG. 5.

Referring to FIG. 6, each of the read commands RCMD may include a physical address field and a valid sector bitmap field.

The physical address field may be configured to store physical address information with respect to a page of the non-volatile memory device 100 read by a corresponding read command RCMD.

The valid sector bitmap field may be configured to store information on at least one plane and at least one sector corresponding to the read command RCMD. The valid sector bitmap field may include bits corresponding to the total number of the sectors in the memory cell array 110.

For example, as shown in FIG. 3, the memory cell array 110 may include the four planes PNE1 to PNE4. Each of the four planes PNE1 to PNE4 may include the two sectors S1 and S2. Thus, the valid sector bitmap field may include the eight bits.

Referring to FIGS. 3 and 6, the valid sector bitmap field of the read command RCMD may include the bits corresponding to each of the first sector S1 of the first plane PNE1, the second sector S2 of the first plane PNE1, the first sector S1 of the second plane PNE2, the second sector S2 of the second plane PNE2, the first sector S1 of the third plane PNE3, the second sector S2 of the third plane PNE3, the first sector S1 of the fourth plane PNE4, and the second sector S2 of the fourth plane PNE4.

Each of the bits in the valid sector bitmap field may be set as '0' or '1'. For example, the memory interface unit 240 may determine the sectors of the plane having the bit of '0' as a non-read region and the sectors of the plane having the bit of '1' as a read region.

The read range calculating unit RRC may detect the read commands for the same physical address among the read commands RCMD1 to RCMDk on which the queuing operation may be performed by the read command queuing unit RCQ. For example, the read range calculating unit RRC may detect the read commands for the same physical address based on the physical address information stored in the physical address field of each of the read commands RCMD1 to RCMDk.

The read range calculating unit RRC may calculate the read range including read regions of each of the detected read commands based on the information stored in the valid sector bitmap field of each of the read commands for the same physical address.

FIG. 7 is a diagram illustrating operations of the read command manager RCM for calculating the read range and generating the integral read command CRCMD. In FIG. 7, first to fourth read commands RCMD1 to RCMD4 for the same physical address may be detected.

Referring to FIG. 7, the detected first to fourth read commands RCMD1 to RCMD4 may have substantially the same physical address '0x00'. The bits in the valid sector bitmap field of the first read command RCMD1 may be set as '11000000'. The bits in the valid sector bitmap field of the second read command RCMD2 may be set as '00110000'. The bits in the valid sector bitmap field of the third read command RCMD3 may be set as '00001100'. The bits in the valid sector bitmap field of the fourth read command RCMD4 may be set as '00000011'. Thus, the first to fourth read commands RCMD1 to RCMD4 may have different read regions.

That is, the read region of the first read command RCMD1 may be the first and second sectors S1 and S2 of the first plane PNE1 (See FIG. 6). The read region of the second read command RCMD2 may be the first and second sectors S1 and S2 of the second plane PNE2 (See FIG. 6). The read region of the third read command RCMD3 may be the first and second sectors S1 and S2 of the third plane PNE3 (See FIG. 6). The read region of the fourth read command RCMD4 may be the first and second sectors S1 and S2 of the fourth plane PNE4 (See FIG. 6).

In a conventional memory interface unit, the first to fourth read commands RCMD1 to RCMD4 may be individually transmitted to the non-volatile memory device 100. The control logic 170 may control the non-volatile memory device 100 to individually perform sensing and transmitting operations in response to each of the first to fourth read commands RCMD1 to RCMD4. Here, the sensing operation may correspond to reading the data from the memory cell array 110 and to temporarily storing the read data in the page buffer 130. The transmitting operation may correspond to transmitting the read data in the page buffer 130 to the controller 200 and to temporarily storing the read data in the user data region UDR of the random access memory 230.

In contrast, according to the present embodiment, the read range calculating unit RRC may perform an OR operation on the valid sector bitmap fields of the first to fourth read commands RCMD1 to RCMD4. The read range calculating unit RRC may calculate the read range including the read regions, for example, the sectors to be read in response to the first to fourth read commands RCMD1 to RCMD4.

For example, as shown in FIG. 7, the read range calculating unit RRC may calculate the read range by performing an OR operation on the bits of the valid sector bitmap field of each of the first to fourth read commands RCMD1 to RCMD4 bit by bit. That is, the read range calculating unit RRC may calculate the read range by performing the OR operation on first bits B0 of the valid sector bitmap fields of the first to fourth read commands RCMD1 to RCMD4, on second bits B1 of the valid sector bitmap fields of the first to fourth read commands RCMD1 to RCMD4, on third bits B2 of the valid sector bitmap fields of the first to fourth read commands RCMD1 to RCMD4, on fourth bits B3 of the valid sector bitmap fields of the first to fourth read commands RCMD1 to RCMD4, on fifth bits B4 of the valid sector bitmap fields of the first to fourth read commands RCMD1 to RCMD4, on sixth bits B5 of the valid sector bitmap fields of the first to fourth read commands RCMD1 to RCMD4, on seventh bits B6 of the valid sector bitmap fields of the first to fourth read commands RCMD1 to RCMD4, and on eighth bits B7 of the valid sector bitmap fields of the first to fourth read commands RCMD1 to RCMD4.

As shown in FIG. 7, the read range calculated by the read range calculating unit RRC may be '11111111'. That is, the read range may include all sectors of all planes of the corresponding physical address (0x00).

The integral read command generating unit CRCG may generate the integral read command CRCMD for instructing the read operation on the calculated read range by the read range calculating unit RRC. The integral read command generating unit CRCG may provide the non-volatile memory device 100 with the generated integral read command CRCMD. As shown in FIG. 7, values stored in the physical address field and the valid sector bitmap field of the generated integral read command CRCMD may be '0x00' and '11111111'.

The non-volatile memory device 100 receiving the integral read command CRCMD from the memory interface unit 240 may perform the read operation on the sectors S1 and S2 of all of the planes PNE1 to PNE4 corresponding to the corresponding physical address. As mentioned above, the read operation may include the sensing operation and the transmitting operation.

Therefore, the memory interface unit 240 may simultaneously receive the read data corresponding to the first to fourth read commands RCMD1 to RCMD4 from the non-volatile memory device 100. The memory interface unit 240 may store the received read data in at least one of the buffers BF0 to BFn of the user data region UDR in the random access memory 230.

Figure 8:
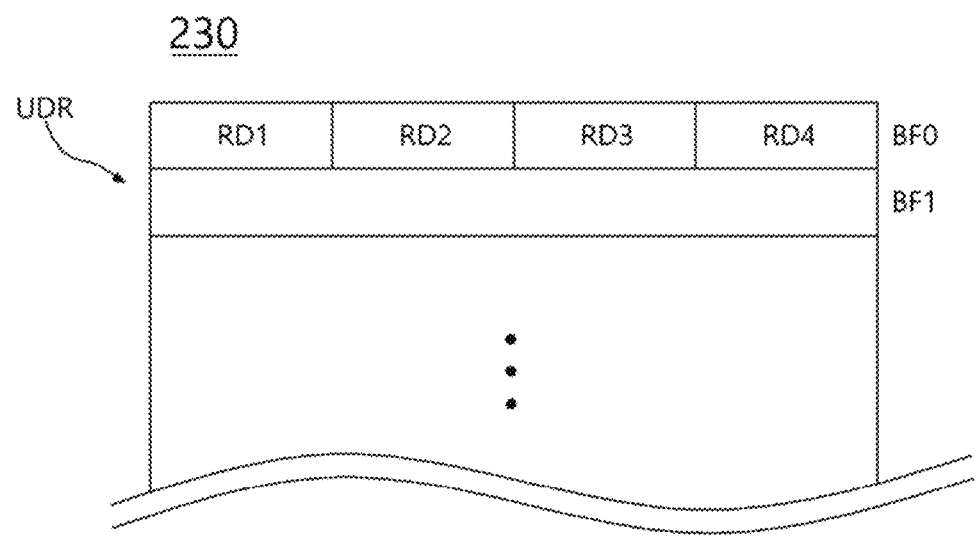
FIG. 8 is a diagram illustrating read data stored in the random access memory, in response to an integral read command.

FIG. 8 is a diagram illustrating the read data stored in the random access memory 230, in response to the integral read command CRCMD.

Referring to FIG. 8, first read data RD1 corresponding to the first read command RCMD1, second read data RD2 corresponding to the second read command RCMD2, third read data RD3 corresponding to the third read command RCMD3, and fourth read data RD4 corresponding to the fourth read command RCMD4 may be stored in the buffer BF0 of the user data region UDR in the random access memory 230.

In FIG. 8, the first to fourth read data RD1 to RD4 may be sequentially stored in the buffer of the random access memory 230. However, storages of the first to fourth read data RD1 to RD4 in the buffers of the random access memory 230 may not be restricted within a specific manner.

The processor 220 may transmit the first to fourth read data RD1 to RD4 in the random access memory 230 to the host device according to first to fourth requests of the host device corresponding to the first to fourth read commands RCMD1 to RCMD4.

Generally, in the conventional art, when the first to fourth read commands RCMD1 to RCMD4 for the same physical address are received, the sensing operation and the transmitting operation are separately performed in response to each of the read commands so that the four sensing operations and the four transmitting operations may be performed. Thus, because the sensing operation for the same physical address may be repeated continuously, characteristics of the memory cells may be deteriorated. Further, because the sensing operation and the transmitting operation in response to the read commands are separately performed, the read capacity may also decrease.

According to the present embodiment of the invention, only one sensing operation and four transmitting operations for the same physical address are performed to simultaneously read the read data so that the number of the sensing operation and the transmitting operations on the specific memory cell is remarkably reduced. As a result, the characteristics of the memory cell may not be deteriorated or deteriorate at a much slower pace than in the conventional art.

Further, the read data corresponding to the read commands may be simultaneously received to be stored in the random access memory. The stored read data may be read from the random access memory and transmitted to the host device. As a result, the read capacity may be improved.

Figure 9:
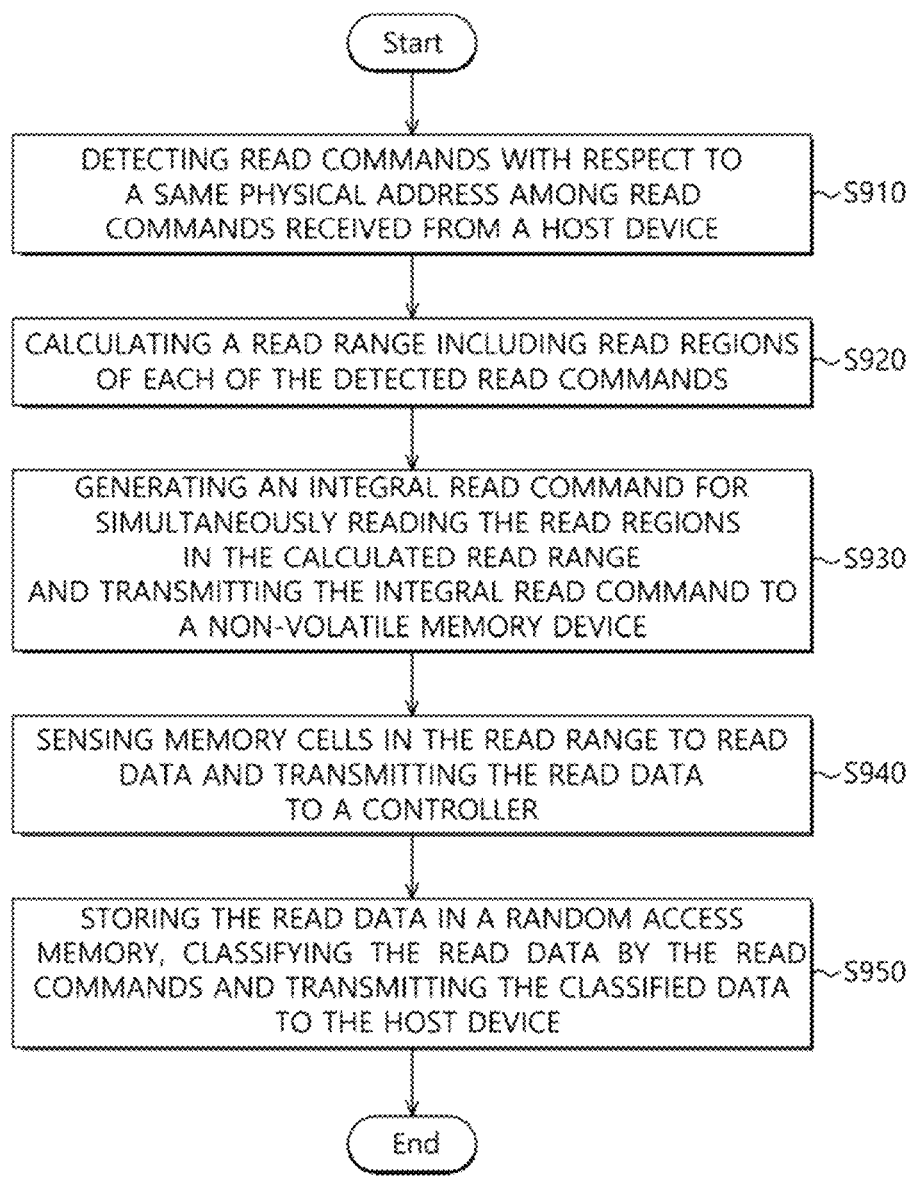
FIG. 9 is a flow chart explaining a method of operating a data storage device in accordance with an embodiment of the present invention.

FIG. 9 is a flow chart illustrating a method of operating a data storage device in accordance with an embodiment of the present invention.

Referring to FIG. 9, in step S910, the controller 200 may detect the read commands for the same physical address, among the read commands received from the host device. For example, the detection of the read commands for the same physical address may be performed by the read range calculating unit RRC of the read command manager RCM in the memory interface unit 240 of the controller 200.

In step S920, the read range calculating unit RRC of the read command manger RCM may calculate the read range including the read regions of each of the detected read commands, i.e., the read commands for the same physical address. For example, the read range calculating unit RRC may perform the OR operation on the bits in the valid sector bitmap field of each of the detected read commands to calculate the read range.

In step S930, the integral read command generating unit CRCG of the read command manager RCM may generate the integral read command CRCMD for simultaneously reading the read regions in the read range. The integral read command generating unit CRCG may provide the non-volatile memory device 100 with the generated integral read command CRCMD.

In step S940, the non-volatile memory device 100 may sense the memory cells in the read range in response to the integral read command CRCMD to read the data. The non-volatile memory device 100 may transmit the read data to the controller 200.

In step S950, the controller 200 may store the read data received from the non-volatile memory device 100 in the random access memory 230. The controller 200 may classify the read data in the random access memory 230 into data by the corresponding read commands. The controller 200 may transmit the classified data to the host device.

Figure 10:
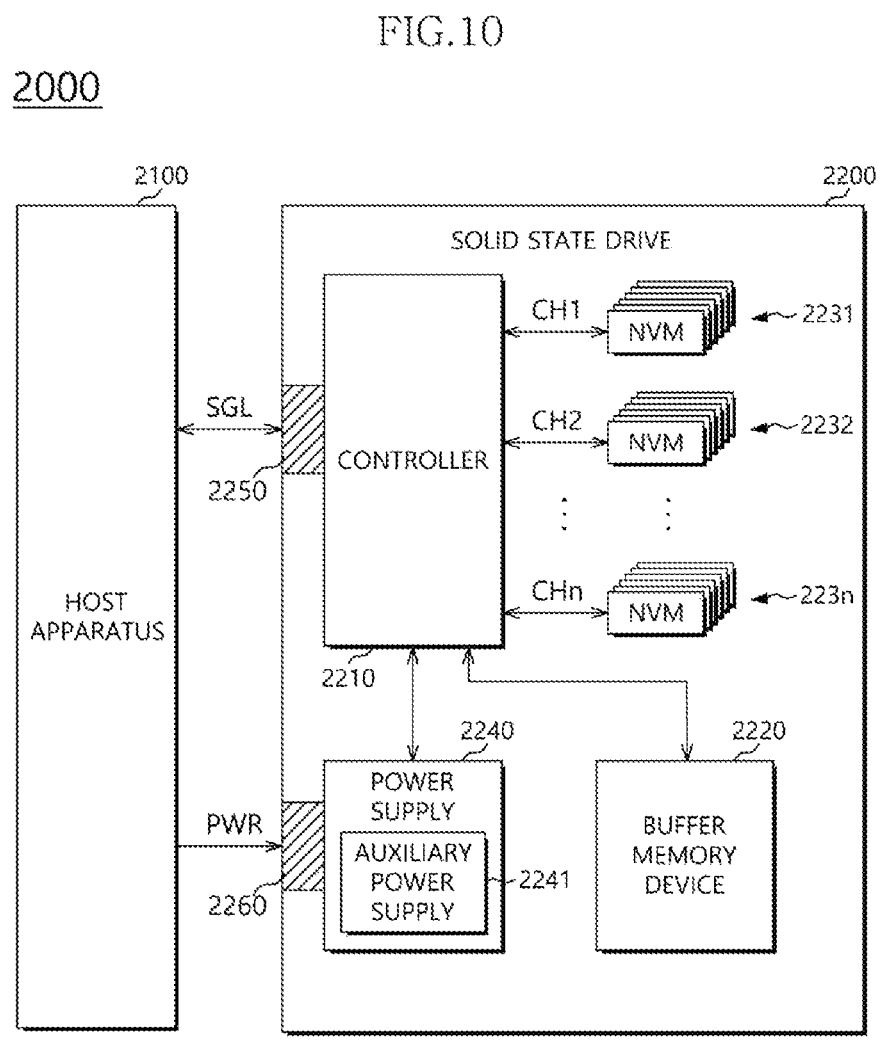
FIG. 10 is a diagram illustrating a data processing system including a solid state drive (SSD) according to an embodiment of the present invention.

FIG. 10 is a diagram illustrating a data processing system 2000 including a solid state drive (SSD) 2200 according to an embodiment of the present invention. Referring to FIG. 10, the data processing system 2000 may include a host apparatus 2100 and the SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn, respectively. One or more nonvolatile memory devices may be coupled to one channel. The nonvolatile memory devices coupled to each channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR. The power connector 2260 may be configured by various types of connectors depending on a power supply scheme of the host device 2100.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 11:
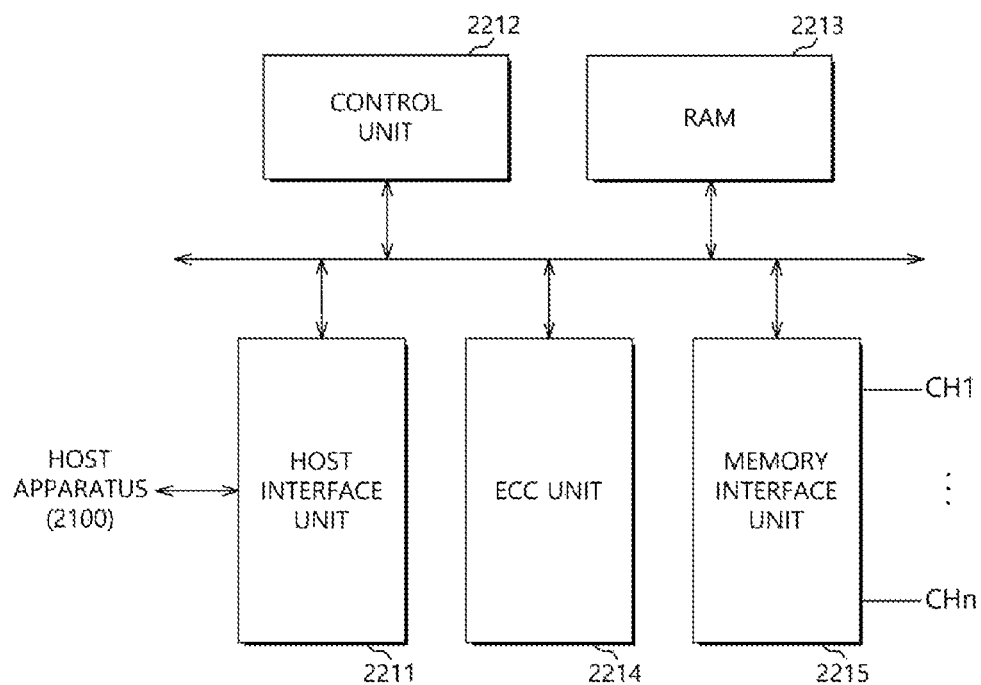
FIG. 11 is a diagram illustrating an exemplary configuration of a controller illustrated shown in FIG. 10.

FIG. 11 is a diagram illustrating the controller 2210 of FIG. 10. Referring to FIG. 11, the controller 2210 may include a host interface unit 2211, a control unit 2212, a random access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD

2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 12:
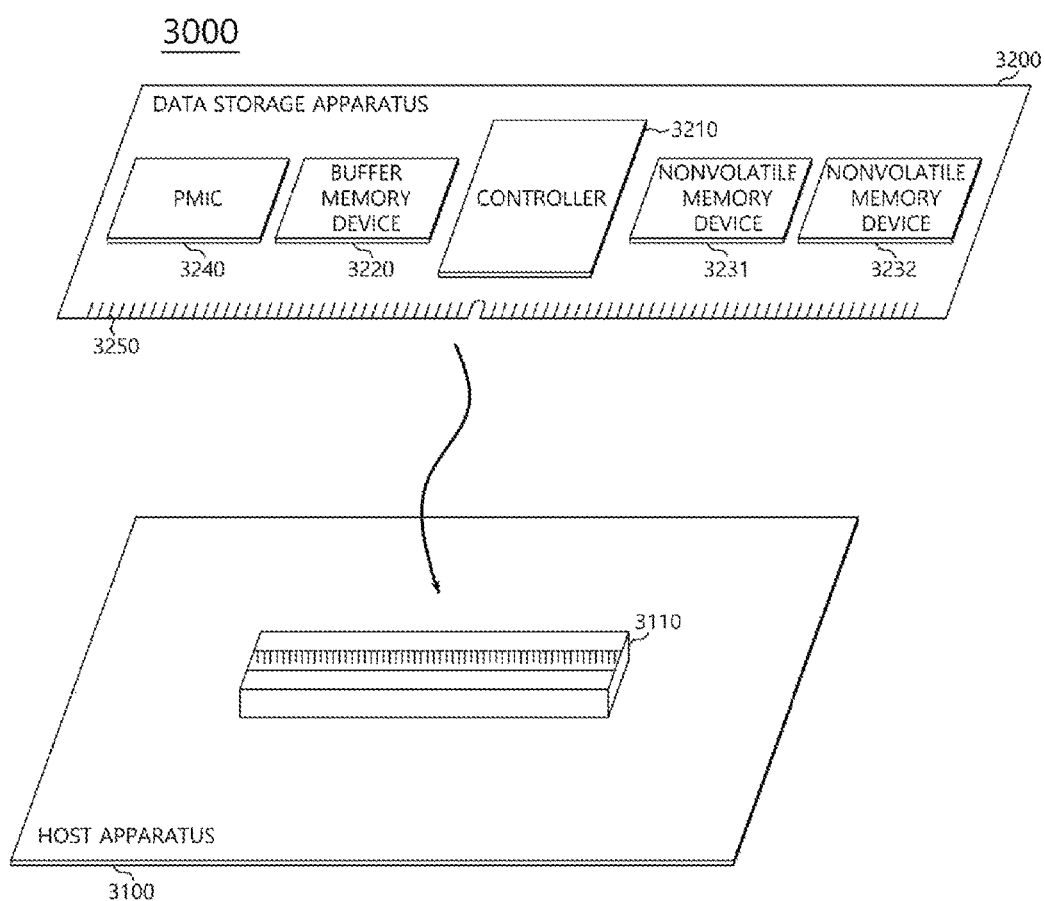
FIG. 12 is a diagram illustrating a data processing system including a data storage apparatus according to an embodiment of the present invention.

FIG. 12 is a diagram illustrating a data processing system 3000 including a data storage apparatus 3200 according to an embodiment of the present invention. Referring to FIG. 12, the data processing system 3000 may include a host apparatus 3100 and the data storage apparatus 3200.

The host apparatus 3100 may be configured in a board form such as a printed circuit board (PCB). Although not shown in FIG. 12, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 and 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 11.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 13:
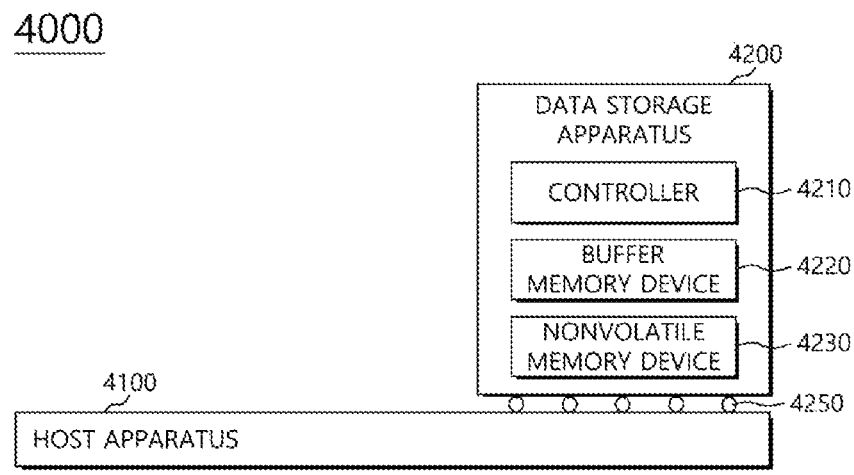
FIG. 13 is a diagram illustrating a data processing system including a data storage apparatus according to an embodiment of the present invention.

FIG. 13 is a diagram illustrating a data processing system 4000 including a data storage apparatus 4200 according to an embodiment of the present invention. Referring to FIG. 13, the data processing system 4000 may include a host apparatus 4100 and the data storage apparatus 4200.

The host apparatus 4100 may be configured in a board form such as a PCB. Although not shown in FIG. 13, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 11.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 14:
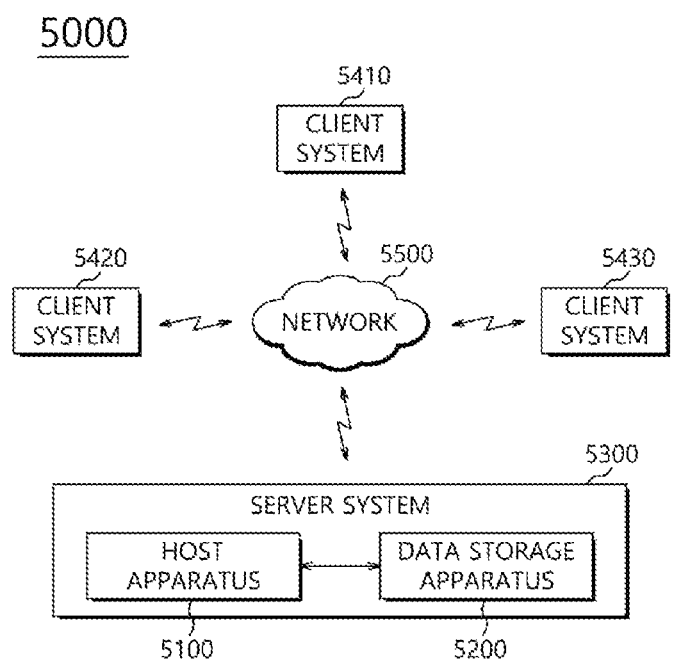
FIG. 14 is a diagram illustrating a network system including a data storage apparatus according to an embodiment of the present invention.

FIG. 14 is a diagram illustrating a network system 5000 including a data storage apparatus 5200 according to an embodiment. Referring to FIG. 14, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and the data storage apparatus 5200. The data storage apparatus 5200 may be configured of the data storage apparatus 10 of FIG. 1, the data storage apparatus 2200 of FIG. 10, the data storage apparatus 3200 of FIG. 12, or the data storage apparatus 4200 of FIG. 13.

The above embodiments of the present invention are illustrative and not limitative. Various alternatives and equivalents are possible. The examples of the embodiments are not limited by the embodiments described herein. Nor is the present invention limited to any specific type of semiconductor device. Other additions, subtractions, or modifications are obvious in view of the present invention and are intended to fall within the scope of the appended claims.

What is claimed is:
1. A data storage device comprising:
   a non-volatile memory device; and
   a controller configured to control operations of the non-volatile memory device,
      wherein the controller includes:
         a read range calculating unit configured to calculate a read range including read regions corresponding to each of read commands for the same physical address, among read commands received from a host device; and an integral read command generating unit configured to generate an integral read command for simultaneously reading the read range, and to transmit the integral read command to the non-volatile memory device.

2. The data storage device of claim 1, wherein the controller comprises:
a memory interface unit configured to transmit/receive data to/from the non-volatile memory device;
a random access memory configured to temporarily store the data; and
a processor configured to control operations of the controller.

3. The data storage device of claim 2, wherein the memory interface unit comprises:
a read command queuing unit configured to perform a queuing operation in response to the read commands;
the read range calculating unit configured to detect the read commands for the same physical address, among the read commands on which the queuing operation is performed, and to calculate the read range including the read regions of each of the detected read commands; and
the integral read command generating unit configured to generate the integral read command based on the calculated read range.

4. The data storage device of claim 3, wherein the non-volatile memory device comprises a plurality of planes, each of the planes comprises a plurality of blocks, each of the blocks comprises a plurality of pages, and each of the pages comprises two sectors.

5. The data storage device of claim 4, wherein each of read commands comprises:
a physical address field configured to store physical address information on a page in the non-volatile memory device corresponding to the read command; and
a valid sector bitmap field configured to store information on at least one plane and at least one sector corresponding to the read command.

6. The data storage device of claim 5, wherein the valid sector bitmap field comprises a number of bits corresponding to the number of the sectors which is equal to the number of the planes times the number of the sectors in each plane.

7. The data storage device of claim 6, wherein the read range calculating unit performs an OR operation on the bits of the valid sector bitmap field of each of the detected read commands bit by bit to calculate the read range.

8. The data storage device of claim 3, wherein the non-volatile memory device senses memory cells in the read range to read data and to transmit the read data to the memory interface unit, in response to the integral read command.

9. The data storage device of claim 8, wherein the memory interface unit temporarily stores the read data transmitted from the non-volatile memory device in the random access memory, and the processor classifies the read data in the random access memory into data by the read commands, and transmits the classified data to the host device.

10. A method of operating a data storage device, comprising:

providing the data storage device including a non-volatile memory device and a controller for controlling operations of the non-volatile memory device;
detecting read commands for a same physical address, among read commands received from a host device;
calculating a read range including read regions of each of the detected read commands;
generating an integral read command for simultaneously reading the read regions in the calculated read range; and
transmitting the integral read command to the non-volatile memory device.

11. The method of claim 10, wherein the calculating the read range comprises:
performing an OR operation on bits in a valid sector bitmap field of each of the detected read commands bit by bit.

12. The method of claim 11, wherein the non-volatile memory device comprises a plurality of planes, each of the planes comprises a plurality of blocks, each of the blocks comprises a plurality of pages, and each of the pages comprises two sectors.

13. The method of claim 12, wherein each of the valid sector bitmap fields comprises a field configured to store information on at least one plane and at least one sector corresponding to the read command.

14. The method of claim 10, further comprising:
sensing memory cells in the read range to read data in response to the integral read command by the non-volatile memory device;
transmitting the read data to the controller; and
storing the read data in a random access memory of the controller.

15. The method of claim 14, wherein the controller classifies the read data in the random access memory into data by the read commands, and transmits the classified data to the host device.

16. A data storage device comprising:
a non-volatile memory device; and
a controller configured to control operations of the non-volatile memory device,
wherein the controller includes a read command manager configured to manage read commands provided from the controller, the read command manager including:
a read range calculating unit configured to calculate a read range including read regions corresponding to each of the read commands for the same physical address, among read commands received from a host device, and
an integral read command generating unit configured to generate an integral read command for simultaneously reading the read range, and to transmit the integral read command to the non-volatile memory device.

17. The data storage device of claim 16, wherein the non-volatile memory device comprises a plurality of planes, each of the planes comprises a plurality of blocks, each of the blocks comprises a plurality of pages, and each of the pages comprises two sectors.

18. The data storage device of claim 17, wherein each of read commands comprises:
a physical address field configured to store physical address information on a page in the non-volatile memory device corresponding to the read command; and a valid sector bitmap field configured to store information on at least one plane and at least one sector corresponding to the read command.

19. The data storage device of claim 18, wherein the read range calculating unit calculates the read range by performing an OR operation on the bits of the valid sector bitmap field of each of the detected read commands bit by bit.

20. The data storage device of claim 16, wherein the non-volatile memory device senses memory cells in the read range to read data and to transmit the read data to the controller, in response to the integral read command, and
　　wherein the controller temporarily stores the read data transmitted from the non-volatile memory device in a random access memory, classifies the read data in the random access memory into data by the read commands, and transmits the classified data to the host device.

* * * * *